United States Patent
Chen et al.

(10) Patent No.: US 8,031,465 B2
(45) Date of Patent: Oct. 4, 2011

(54) ELECTRONIC APPARATUS (75) Inventors: Chien-Ying Chen, Taipei (TW); Chih-Wei Chou, Taipei (TW)

(73) Assignee: Asustek Computer Inc., Taipei (TW)

(*) Notice: Subject to any disclaimer, the term of this patent is extended or adjusted under 35 U.S.C. 154(b) by 131 days.

(21) Appl. No.: 12/477,001

(22) Filed: Jun. 2, 2009

(65) Prior Publication Data

US 2010/0020479 A1    Jan. 28, 2010

(30) Foreign Application Priority Data

Jul. 25, 2008    (TW) .............................. 97128242 A (51) Int. Cl.
*G06F 1/16*    (2006.01)

(52) U.S. Cl. .............. 361/679.54; 361/679.46; 361/702; 361/709; 439/327; 439/928.1; 439/945; 439/946

(58) Field of Classification Search .................. 361/801, 361/679.54

See application file for complete search history.

(56) References Cited

U.S. PATENT DOCUMENTS

| | | | | |
|---|---|---|---|---|
| 3,644,868 A | * | 2/1972 | Nevala | 439/61 |
| 5,544,006 A | * | 8/1996 | Radloff et al. | 361/679.32 |
| 5,650,917 A | * | 7/1997 | Hsu | 361/759 |
| 5,684,674 A | * | 11/1997 | Yin | 361/695 |
| 5,726,865 A | * | 3/1998 | Webb et al. | 361/801 |
| 6,046,906 A | * | 4/2000 | Tseng | 361/704 |
| 6,064,574 A | * | 5/2000 | Yu et al. | 361/704 |
| 6,083,026 A | * | 7/2000 | Trout et al. | 439/328 |
| 6,126,471 A | * | 10/2000 | Yu et al. | 439/327 |
| 6,160,706 A | * | 12/2000 | Davis et al. | 361/704 |
| 6,449,163 B1 | * | 9/2002 | Stark et al. | 361/752 |
| 6,585,534 B2 | * | 7/2003 | Llapitan et al. | 439/327 |
| 7,265,996 B2 | * | 9/2007 | Fan et al. | 361/801 |
| 7,817,433 B2 | * | 10/2010 | Wu et al. | 361/747 |
| 2004/0190268 A1 | | 9/2004 | Ling et al. | |
| 2005/0085113 A1 | | 4/2005 | Hill et al. | |
| 2005/0149767 A1 | * | 7/2005 | Fei | 713/300 |
| 2007/0206368 A1 | | 9/2007 | Zhang et al. | |
| 2007/0291460 A1 | * | 12/2007 | Chu | 361/801 |

FOREIGN PATENT DOCUMENTS

| | | |
|---|---|---|
| CN | 2701114 Y | 5/2005 |
| CN | 2764020 Y | 3/2006 |
| CN | 2891585 Y | 4/2007 |
| TW | 375294 | 11/1999 |
| TW | 435741 U | 5/2001 |
| TW | 501757 U | 9/2002 |

* cited by examiner

*Primary Examiner* — Jayprakash N Gandhi
*Assistant Examiner* — Anthony Q Edwards
(74) *Attorney, Agent, or Firm* — Morris Manning Martin LLP; Tim Tingkang Xia, Esq.

(57) ABSTRACT

The invention discloses an electronic apparatus comprising a motherboard, a connector, a card member and a first holder. The connector is disposed on the motherboard and the card member is disposed on the connector. The motherboard comprises a first fixing portion and the card member comprises a second fixing portion. The first holder comprises a third fixing portion fixed to the first fixing portion of the motherboard and a fourth fixing portion fixed to the second fixing portion of the card member. Accordingly, once the motherboard or the card member is hit or pulled by an external force, since two ends of the first holder respectively fix the card member and the motherboard, the card member will not be detached from the connector, such that the card member can be connected to the connector well.

7 Claims, 7 Drawing Sheets

ELECTRONIC APPARATUS

BACKGROUND OF THE INVENTION

1. Field of the Invention

This invention relates to an electronic apparatus, and more particularly to an electronic apparatus which fixes a card member on a motherboard with a holder.

2. Description of the Prior Art

With the rising and flourishing of technologies and information nowadays, computers have been popularized electronic apparatuses. Presently, all of the electronic apparatuses sold in the market (e.g., desktops, laptops, or severs) are connected to peripheral hardware via various kinds of card members. For example, those card members can be interface cards for the hosts that connect to peripheral hardware, to let the hosts communicate and transmit signals with the peripheral hardware and perform the functions of the peripheral hardware. In a traditional electronic apparatus, many interface cards are usually inserted into the motherboard, such as a VGA (Video Graphic Array) card, an audio card, a network card, a USB (Universal Serial Bus) interface card, memory, etc., to expand functions or increasing the performance of the electronic apparatus.

Generally, one or more interface card connectors will be disposed on a motherboard. An interface card is inserted in a corresponding interface card connector with the side which has signal terminals on the interface card. Concurrently, the interface card is fixed on the motherboard with the clamping force of the interface card connector. However, the method of fixing is not firm. If the motherboard is hit or pulled by an external force during transportation or usage of the motherboard, the interface cards will not stay fixed on the interface card connector, which means the interface card will not be electrically connected to the motherboard efficiently.

SUMMARY OF THE INVENTION

An objective of the invention is to provide an electronic apparatus. The electronic apparatus fixes a card member on a motherboard with a holder, to prevent a card member from departing from the motherboard while being hit or pulled by an external force.

According to an embodiment, the electronic apparatus of the invention includes a motherboard, a connector, a card member, and a first holder. The connecter is disposed on the motherboard, and the card member is installed on the connector. The motherboard includes a first fixing portion, and the card member includes a second fixing portion. The first holder includes a third fixing portion and a fourth fixing portion.

In the embodiment, the third fixing portion of the first holder is fixed to the first fixing potion of the motherboard, and the fourth fixing portion of the first holder is fixed to the second fixing portion of the card member. Thereby, once the motherboard or the card member is hit or pulled by an external force, since two ends of the first holder respectively fix the card member and the motherboard, the card member will not be detached from the connector, such that the card member can be connected to the connector well.

According to another embodiment, besides the above-mentioned components, the electronic apparatus of the invention further includes a second holder, wherein the second holder includes a sixth fixing portion and a second engaging portion. In order to be adapted to the second holder, the foregoing card member can further include a fifth fixing portion, and the connector can include a first engaging portion.

In the embodiment, the sixth fixing portion of the second holder is fixed to the fifth fixing portion of the card member, and the second engaging portion of the second holder is engaged with the first engaging portion of the connector. Thereby, the second holder can be adapted to the first holder to firmly fix the card member on the motherboard.

The advantage and spirit of the invention may be understood by the following recitations together with the appended drawings.

DETAILED DESCRIPTION OF THE INVENTION

Figure 1:
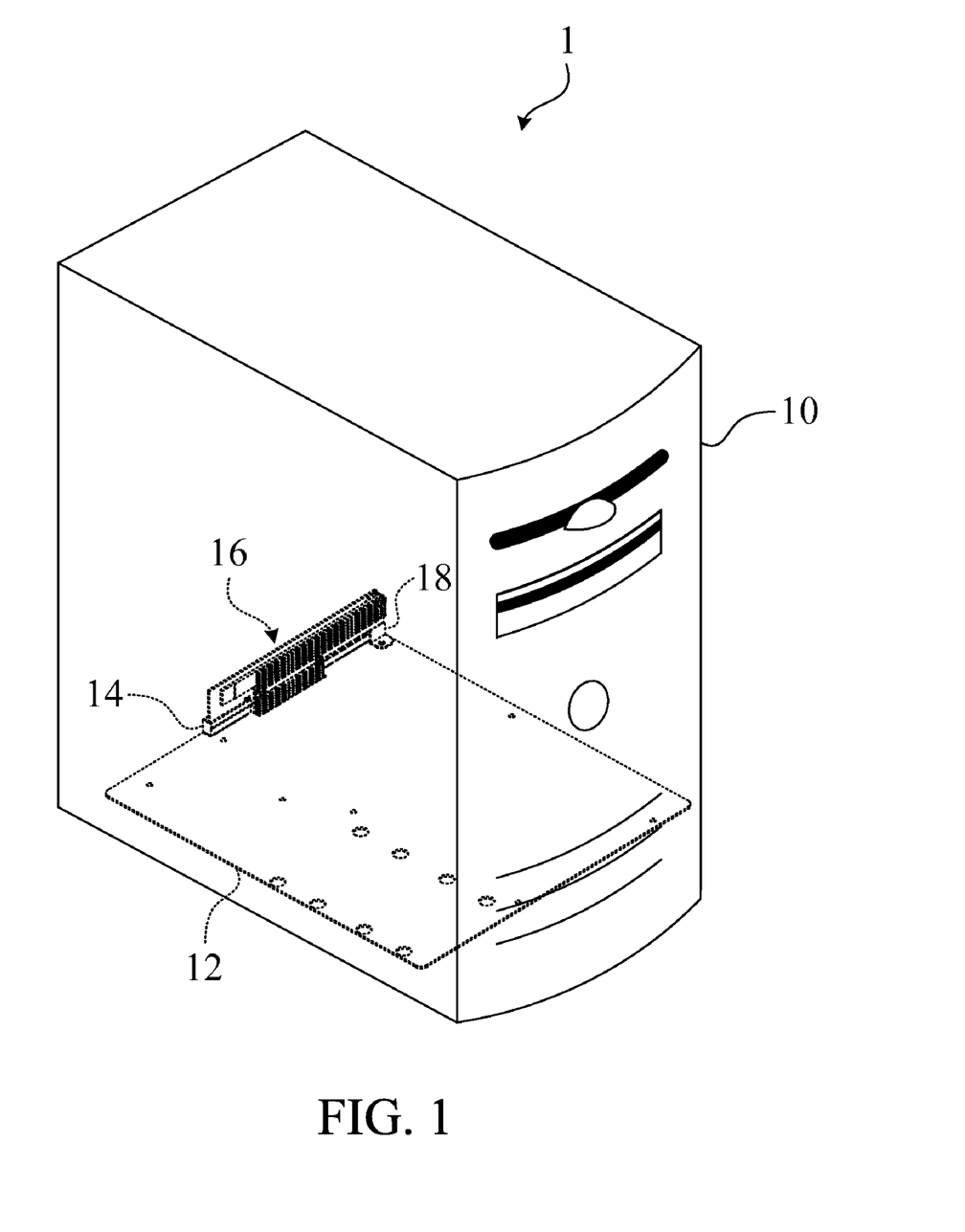
FIG. 1 is a schematic diagram illustrating that a motherboard is disposed in an electronic apparatus according to an embodiment of the invention.
Figure 2:
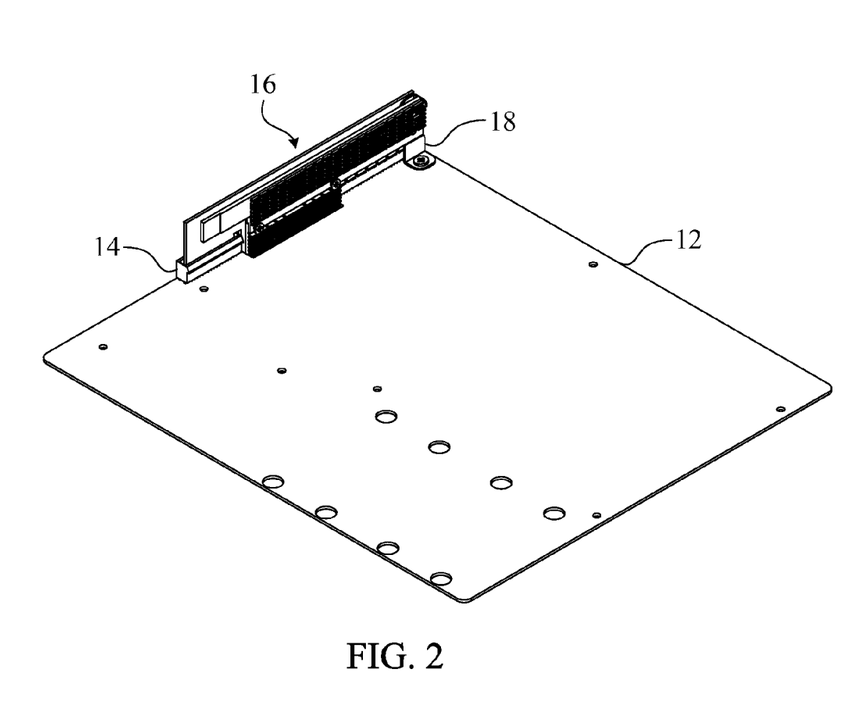
FIG. 2 is an enlarged view illustrating the motherboard and the components which are disposed on the motherboard in FIG. 1.
Figure 3:
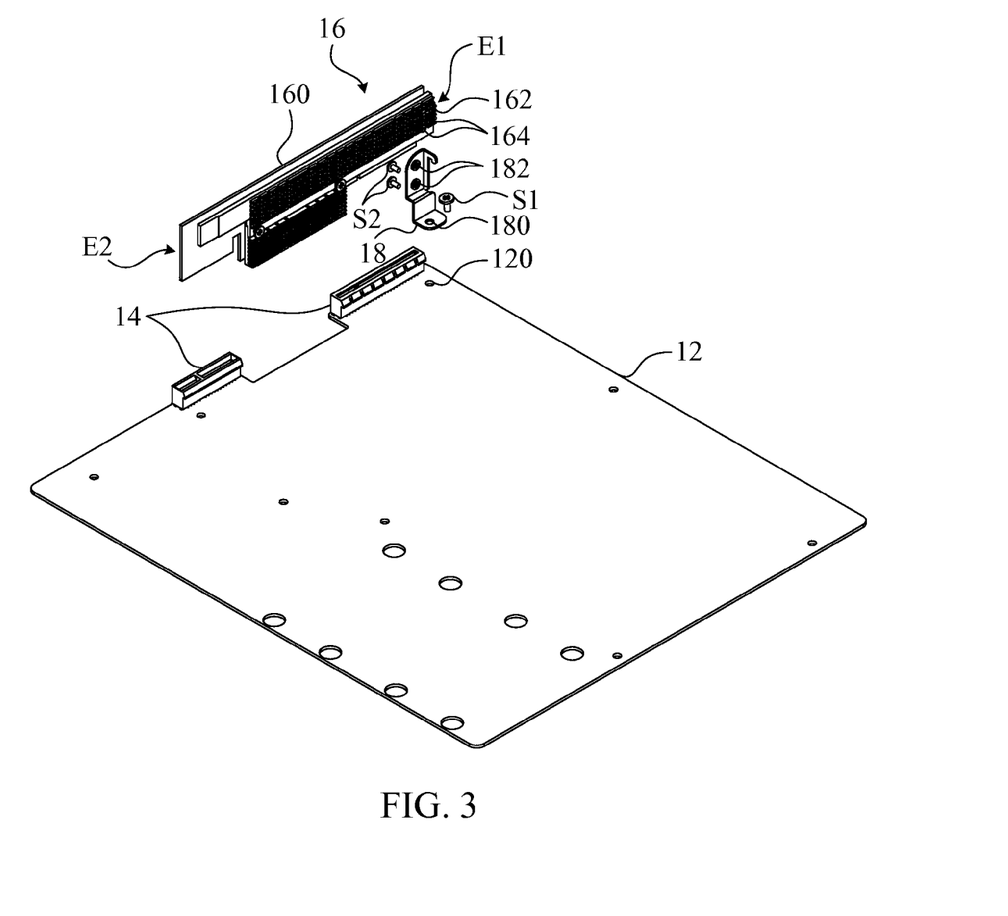
FIG. 3 is an exploded view illustrating the motherboard and the components which are disposed on the motherboard in FIG. 2.

Please refer from FIG. 1 to FIG. 3. FIG. 1 is a schematic diagram illustrating that a motherboard 12 is disposed in an electronic apparatus 1 according to an embodiment of the invention. FIG. 2 is an enlarged view illustrating the motherboard 12 and the components which are disposed on the motherboard 12 in FIG. 1. FIG. 3 is an exploded view illustrating the motherboard 12 and the components which are disposed on the motherboard 12 in FIG. 2. The electronic apparatus 1 in FIG. 1 takes a computer as an example, but the electronic apparatus 1 is not limited to be a computer.

As shown in FIG. 1 to FIG. 3, the electronic apparatus 1 includes a case 10, a motherboard 12, a connector 14, a card member 16, and a first holder 18. Generally, besides the motherboard 12, many electronic devices (not shown) having different functions are disposed in the case 10, such as a fan, a hard disk drive, a CD-ROM drive, a power supply, etc. The functions of the above-mentioned components can be easily achieved and applied by the people skilled in the art, so they will not be described in detail here.

The connector 14 is disposed on the motherboard 12. The connector 14 can be a PCI (Peripheral Component Interconnect) connector or a PCI-E (PCI Express) connector. Generally, besides the connector 14, many electronic components or slots (not shown) are disposed on the motherboard 12, such as a memory slot, a north bridge, a south bridge, integrated peripherals, a BIOS (Basic Input/Optical System), and a power supply, etc. The functions of the above-mentioned components can be easily achieved and applied by the people skilled in the art, so they will not be described in detail here. To describe the technical features of the invention conveniently, only the connector 14 is drawn on the motherboard 12 in FIG. 3.

The side having signal terminals of the card member 16 is inserted in the slot of the connector 14, to be electrically connected to the motherboard 12. For expanding functions or performances to the electronic apparatus 1, the card member 16 can be an interface card, such as a VGA card, an audio card, a network card, a USB (Universal Serial Bus) interface card, memory, etc. Additionally, if the card member 16 is a high performance card member, the card member 16 will produce a great deal of heat during operation. Therefore, a heat-dissipating base 162 is usually installed on the main body 160 of the card member 16 to dissipate the heat.

As shown in FIG. 3, the motherboard 12 includes a first fixing portion 120, and the card member 16 includes a second fixing portion 164. In the embodiment, the second fixing portion 164 is formed on the heat-dissipating base 162. In another embodiment, the second fixing portion 164 also can be formed on the main body 160 and is not limited to the type in FIG. 3. The card member 16 has a first side portion E1 and a second side portion E2, and the second fixing portion 164 in FIG. 3 is at the first side portion E1. However, in a practical application, the second fixing portion 164 also can be formed at the second side portion E2, the center of the heat-dissipating base 162, or any location of the heat-dissipating base 162, and the location of the first fixing portion 120 on the motherboard 12 corresponds to that of the second fixing portion 164 on the card member 16. Besides, the first holder 18 includes a third fixing portion 180 and the fourth fixing portion 182.

In the embodiment, the first fixing portion 120, the second fixing portion 164, the third fixing portion 180, and the fourth fixing portion 182 are designed to be screw holes, so that the third fixing portion 180 can be fixed to the first fixing portion 120 with a screw S1, and the fourth fixing portion 182 can be fixed to the second fixing portion 164 with a screw S2. It is notable that the third fixing portion 180 and the fourth fixing portion 182 also can be respectively fixed to the first fixing portion 120 and the second fixing portion 164 by welding, riveting, or other machining processes, rather than being limited to be fixed with screws.

Before the card member 16 is assembled to the connector 14 of the motherboard 12, the fourth fixing portion 182 of the first holder 18 firstly can be fixed to the second fixing portion 164 of the card member 16 according to the embodiment. Next, the side having signal terminals of the card member 16 is inserted in the slot of the connector 14. Finally, the third fixing portion 180 of the first holder 18 is fixed to the first fixing portion 120 of the motherboard 12. Thereby, once the motherboard 12 or the card member 16 is hit or pulled by an external force, since two ends of the first holder 18 respectively fix the card member 16 and the motherboard 12, the card member 16 will not be detached from the connector 14, such that the card member 16 can be connected to the connector 14 well.

Figure 4:
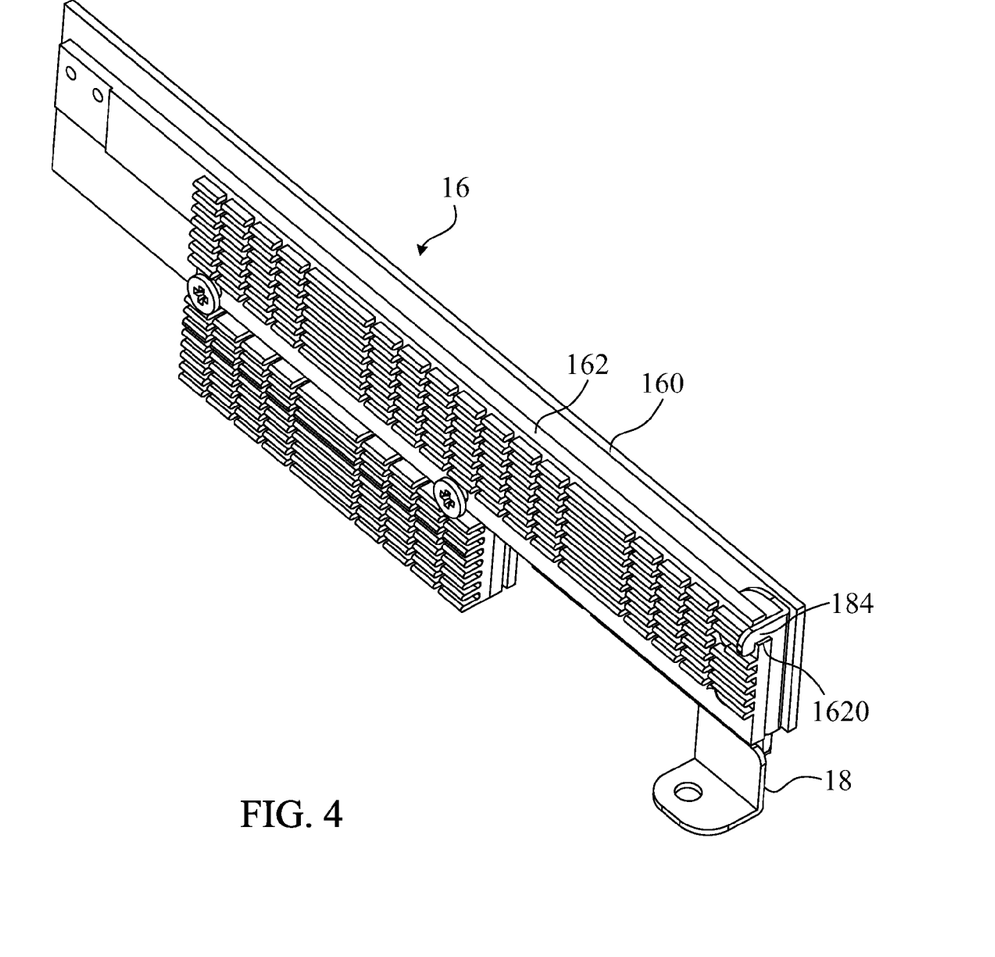
FIG. 4 is schematic diagram illustrating that the first holder is fixed to the card member.

Please refer to the FIG. 4. FIG. 4 is schematic diagram illustrating that the first holder 18 is fixed to the card member 16. As shown in FIG. 4, the heat-dissipating base 162 of the card member 18 can further include a first retaining portion 1620, and the first holder 18 can further include a second retaining portion 184. When the first holder 18 is fixed to the card member 16, the second retaining portion 184 and the first retaining portion 1620 are engaged to each other to retain the movement of the card member 16.

Figure 5:
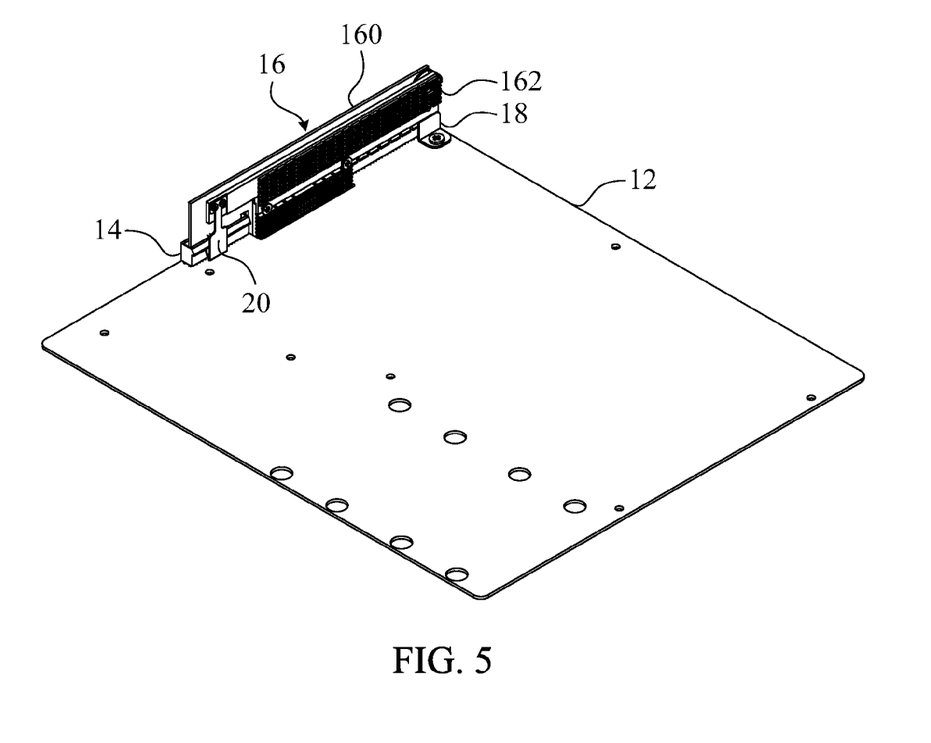
FIG. 5 is a schematic diagram illustrating that a second holder is fixed to the card member according to another embodiment of the invention.
Figure 6:
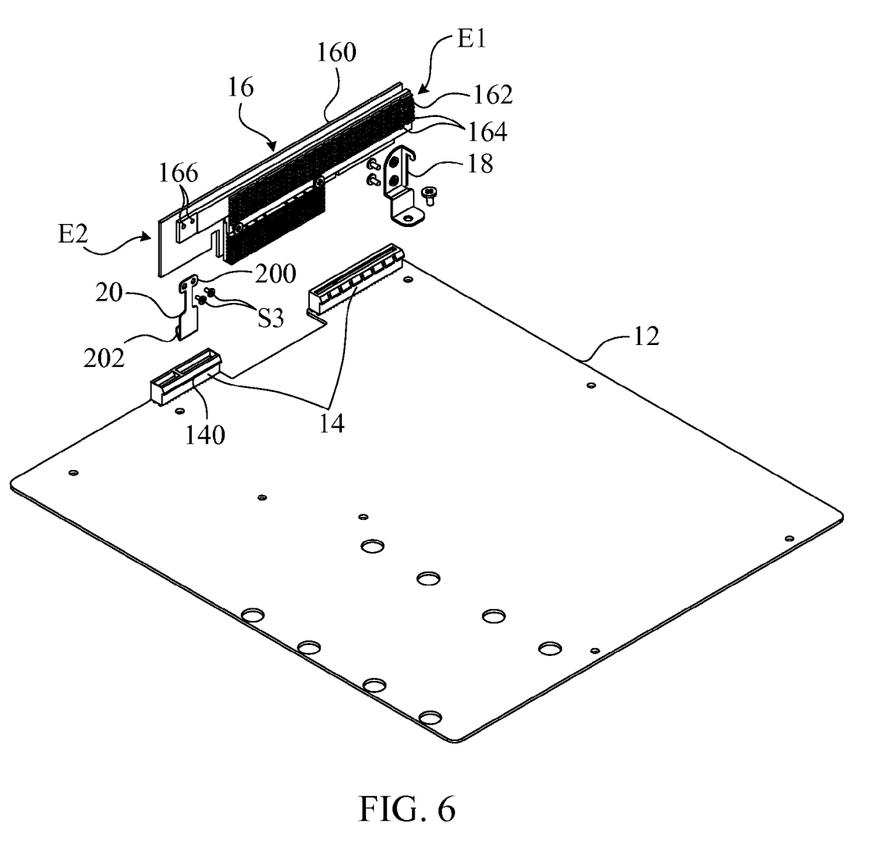
FIG. 6 is an exploded view illustrating the components in FIG. 5.
Figure 7:
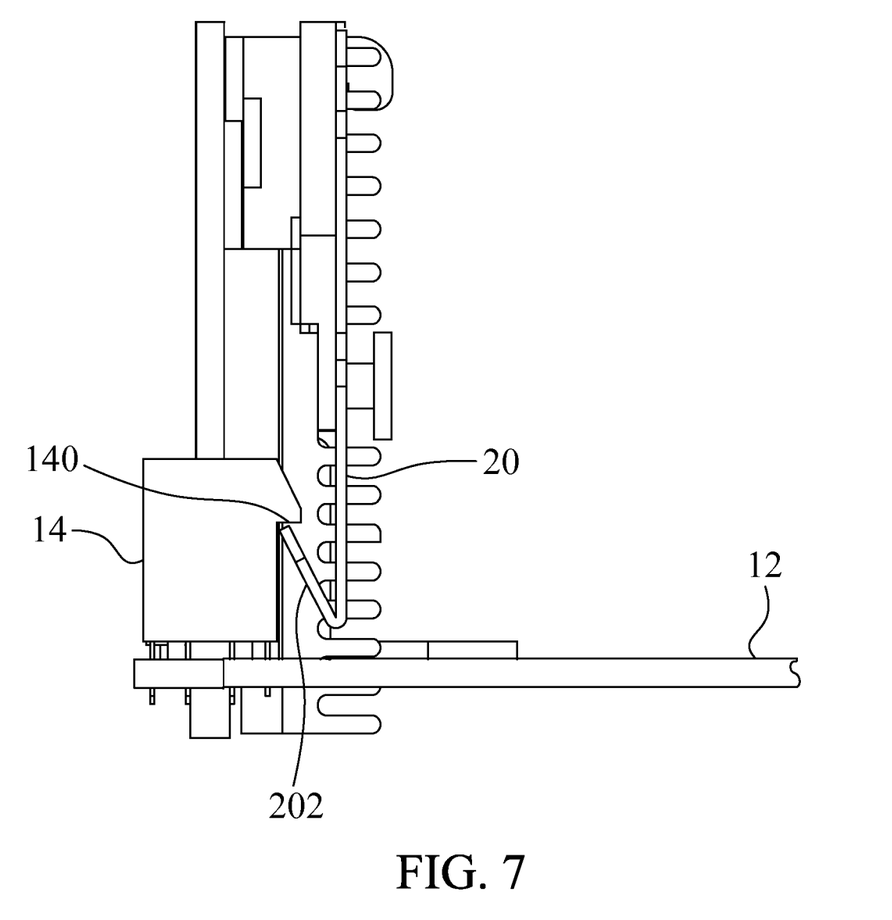
FIG. 7 is a lateral view illustrating the components in FIG. 5.

Please refer from FIG. 5 to FIG. 7. FIG. 5 is a schematic diagram illustrating that a second holder 20 is fixed to the card member 16 according to another embodiment of the invention. FIG. 6 is an exploded view illustrating the components in FIG. 5. FIG. 7 is a lateral view illustrating the components in FIG. 5. In another embodiment of the invention, the card member 16 can be fixed on the motherboard 12 by the first holder 18 and the second holder 20 at the same time.

As shown in FIG. 6, the second holder 20 includes a sixth fixing portion 200 and the second engaging portion 202. To be adapted to the second holder 20, the foregoing card member 16 can further include a fifth fixing portion 166, and the connector 14 can further include a first engaging portion 140. In the embodiment, the fifth fixing portion 166 is formed on the heat-dissipating base 162. In another embodiment, the fifth fixing portion 166 also can be formed on the main body 160 and is not limited to the type in FIG. 6.

In the embodiment, both the fifth fixing portion 166 and the sixth fixing portion 200 are designed to be screw holes, so that the sixth fixing portion 200 can be fixed to the fifth fixing portion 166 with a screw S3. It is notable that the sixth fixing portion 200 also can be fixed to the fifth fixing portion 166 by welding, riveting, or by other machining processes, rather than being limited to be fixed with screws. Furthermore, the first engaging portion 140 and the second engaging portion 202 can form a pair of the engaging structures which are adapted to each other, as shown in FIG. 7.

Before the card member 16 is assembled to the connector 14 of the motherboard 12, the sixth fixing portion 200 of the second holder 20 firstly can be fixed to the fifth fixing portion 166 of the card member 16 according to the embodiment. Next, the side having signal terminals of the card member 16 is inserted in the slot of the connector 14. Finally, the second engaging portion 202 of the second holder 20 is engaged with the first engaging portion 140 of the motherboard 12.

In a practical application, the foregoing second fixing portion 164 can be formed on the first side portion E1 of the card member 16, and the foregoing fifth fixing portion 166 can be formed on the second side portion E2 of the card member 16, as shown in FIG. 6. The first holder 18 and the second holder 20 can respectively fix both sides of the card member 16 to the motherboard 12. Thereby, the second holder 20 and the first holder 18 can operate in coordination to firmly fix the card member 16 on the motherboard 12.

Compared with the prior art, an end of the foregoing first holder is fixed to the card member, and another end of the first holder is fixed on the motherboard according to the invention, once the motherboard or the card member is hit or pulled by an external force, since two ends of the first holder respectively fix the card member and the motherboard, the card member will not be detached from the connector, such that the card member can be connected to the connector well. Additionally, an end of the second holder can be fixed on the card member (i.e., the first holder and the second holder respectively locate at both sides of the card member), and another end of the second holder is engaged to the front end of the connector according to the invention, so as to firmly fix the card on the motherboard.

With the example and explanations above, the features and spirits of the invention will be hopefully well described. Those skilled in the art will readily observe that numerous modifications and alterations of the device may be made while retaining the features and spirit of the invention. Accordingly, the above disclosure should be construed as limited only by the metes and bounds of the appended claims.

What is claimed is:
1. An electronic apparatus comprising:
a motherboard comprising a first fixing portion;
a connector being disposed on the motherboard;
a card member, disposed on the connector, the card member comprising a second fixing portion, a main body and a heat-dissipating base, wherein the second fixing portion is on the heat-dissipating base; and a first holder comprising a third fixing portion and a fourth fixing portion, the third fixing portion being fixed to the first fixing portion, and the fourth fixing portion being fixed to the second fixing portion, wherein the heat-dissipating base comprises a first retaining portion, the first holder comprises a main portion and a second retaining portion, the main portion is disposed between the main body and the heat-dissipating base, the second retaining portion extends from the main portion to the heat-dissipating base for being engaged with the first retaining portion to retain the movement of the card member.

2. The electronic apparatus of claim 1, wherein the third fixing portion is fixed to the first fixing portion by a screw, welding, or riveting.

3. The electronic apparatus of claim 1, wherein the fourth fixing portion is fixed to the second fixing portion by a screw, welding, or riveting.

4. The electronic apparatus of claim 1, wherein the card member comprises a fifth fixing portion, the connector comprises a first engaging portion, the electronic apparatus comprises a second holder, the second holder comprises a sixth fixing portion and a second engaging portion, the sixth fixing portion is fixed to the fifth fixing portion, and the second engaging portion is engaged with the first engaging portion.

5. The electronic apparatus of claim 4, wherein the sixth fixing portion is fixed to the fifth portion by a screw, welding, or riveting.

6. The electronic apparatus of claim 4, wherein the card member has a first side portion and a second side portion, the second fixing portion is on the first side portion, and the fifth fixing portion is on the second side portion.

7. The electronic apparatus of claim 1, wherein the card member is an interface card.

* * * * *